United States Patent [19]

Oppermann

[11] Patent Number: 5,760,424
[45] Date of Patent: Jun. 2, 1998

[54] INTEGRATED CIRCUIT ARRANGEMENT HAVING AT LEAST ONE IGBT

[75] Inventor: Klaus-Guenter Oppermann, Holzkirchen, Germany

[73] Assignee: Siemens Aktiengesellschaft, Munich, Germany

[21] Appl. No.: 600,235

[22] Filed: Feb. 12, 1996

[30] Foreign Application Priority Data

Mar. 1, 1995 [DE] Germany .................. 195 07 169.7

[51] Int. Cl.[6] .................................................. H01L 29/74
[52] U.S. Cl. .................. 257/139; 257/140; 257/143; 257/146; 257/355; 257/378; 257/477; 257/577
[58] Field of Search ............................ 257/139, 355, 257/378, 140, 143, 146, 577, 477

[56] References Cited

U.S. PATENT DOCUMENTS

| 4,901,127 | 2/1990 | Chow et al. |
|---|---|---|
| 5,070,377 | 12/1991 | Harada .................. 257/139 |
| 5,360,984 | 11/1994 | Kirihata .................. 257/139 |

FOREIGN PATENT DOCUMENTS

| 0 371 785 | 5/1989 | European Pat. Off. |
| 2 241 111 | 8/1991 | United Kingdom. |
| 2 261 990 | 6/1993 | United Kingdom. |

OTHER PUBLICATIONS

Patent Abstracts of Japan, Publication No. 02078275, published Mar. 19, 1990 Japanese Application No. 63228671.
Patent Abstracts of Japan, Publication No. 60098671, published Jun. 1, 1985, Japanese Application No. 58204879.
"Lateral Resurfed COMFET," Darwish et al., vol. 20, No. 12, pp. 519–520 (9184)—Jan. 1984.

*Primary Examiner*—Edward Wojciechowicz
*Attorney, Agent, or Firm*—Hill, Steadman & Simpson

[57] ABSTRACT

An integrated circuit arrangement includes an IGBT, provided with a secondary contact connected with the drift area, and a diode connected between the secondary contact and the anode of the IGBT. The cathode of the diode is connected with the anode of the IGBT and the anode of the diode is connected with the secondary contact of the IGBT. In this way the pn-junction of the IGBT, formed through the drift area and the channel area, can be used as an internal free-running diode of the IGBT.

5 Claims, 2 Drawing Sheets

5,760,424

1

INTEGRATED CIRCUIT ARRANGEMENT HAVING AT LEAST ONE IGBT

BACKGROUND OF THE INVENTION

1. Field of the Invention

The present invention is directed to an integrated circuit arrangement of the type having at least one insulated gate bipolar transistor (IGBT).

2. Description of the Prior Art

In H. Dorwish et al., Electronics Letters, vol. 20, no. 12, pp. 519 to 520 (1984), a so-called insulated gate bipolar transistor, abbreviated IGBT, was proposed. This is a high-voltage DMOS transistor, in which the main current flows through a pn-junction polarized in the forward direction. The pn-junction is formed through an emitter structure surrounded by a drift area weakly doped with the opposite conductivity type. In the activated state, charge carriers that increase the conductivity of the drift area are injected by this PN junction.

In the case of a voltage reversal at the IGBT, the pn-junction formed from the emitter structure and the drift area is polarized in the reverse direction. In applications in which a higher current flows in the case of voltage reversal, this pn-junction must first be driven into breakdown before the IGBT can carry this current. High current loads in the breakdown of the pn-junction usually lead to the destruction of the component.

In order to avoid destruction of the component in applications of this sort, a free-running (unbiased) diode is connected parallel to the IGBT, via which the higher current that appears in the case of a voltage reversal can drain. The unbiased diode must be dimensioned for this high current and must have a blocking ability comparable with the blocking ability of the IGBT, and thus such a diode has a high space requirement.

SUMMARY OF THE INVENTION

An object of the present invention to provide an integrated circuit arrangement having an IGBT that has a lower space requirement than known structures and wherein destruction of the IGBT by means of high current during a voltage reversal is avoided.

The above object is achieved in accordance with the principles of the present invention in an integrated circuit arrangement having at least one IGBT with a drift area, a channel area, a gate dielectric, a gate electrode, a cathode connected with the source zone and the channel area, an anode connected with the emitter structure, and having a secondary contact connected with the drift area, and the arrangement also including a diode having an anode and a cathode, the diode cathode being connected between the secondary contact and the anode of the IGBT such that the cathode of the diode is connected with the anode of the IGBT and the anode of the diode is connected with the secondary contact of the IGBT.

In the integrated circuit arrangement, the IGBT is provided with an additional secondary contact in connection with the drift area. A diode is connected between the secondary contact and the anode of the IGBT, the anode of this diode being connected with the secondary contact, and its cathode is connected with the anode of the IGBT. In the conductive state of the IGBT, the diode blocks and the main current flow ensues via the anode of the IGBT. For this purpose a diode blocking ability of a few volts, preferably 1 volt to 20 volts, is sufficient. During a voltage reversal, the

2 diode is polarized (biased) in the forward direction and the current flow ensues directly via the secondary contact and the drift area. In this case, the pn-junction formed from the drift area and the channel area acts as an internal free-running diode of the IGBT.

Since the diode need only have a low blocking ability, the space requirement for the diode is significantly lower than that for the additional free-running diode known from the prior art. Since the diode is comparatively simple to manufacture—in particular there are no special photolithographic requirements—the circuit arrangement according to the invention is improved with regard to area requirement, in comparison to the circuit known from the prior art having a high-voltage IGBT and a high-voltage diode.

In comparison to a DMOS transistor, the integrated circuit arrangement according to the invention exhibits a voltage drop of only about 0.5 volts more (the amount of the diode threshold voltage).

A pn-diode or a Schottky diode can be used as the diode in the inventive arrangement.

With regard to the blocking ability of the IGBT, it is advantageous to implement the integrated circuit structure in a silicon layer of an SOI substrate. The IGBT is thereby formed as a lateral IGBT. The IGBT is laterally insulated against the diode by means of an insulating trench and vertically insulated against the diode by means of an insulating layer arranged in the SOI substrate underneath the silicon layer. The insulating trench extends to the surface of the insulating layer. The insulating trench and the insulating layer form an insulating well for the IGBT. The concentration of doping material in the insulating well is preferably adjusted so that in the blocked (nonconducting) state of the IGBT a part of the electrical field is directed into the insulating layer.

The sectional drawings are not to scale.

DESCRIPTION OF THE PREFERRED EMBODIMENTS

Figure 1:
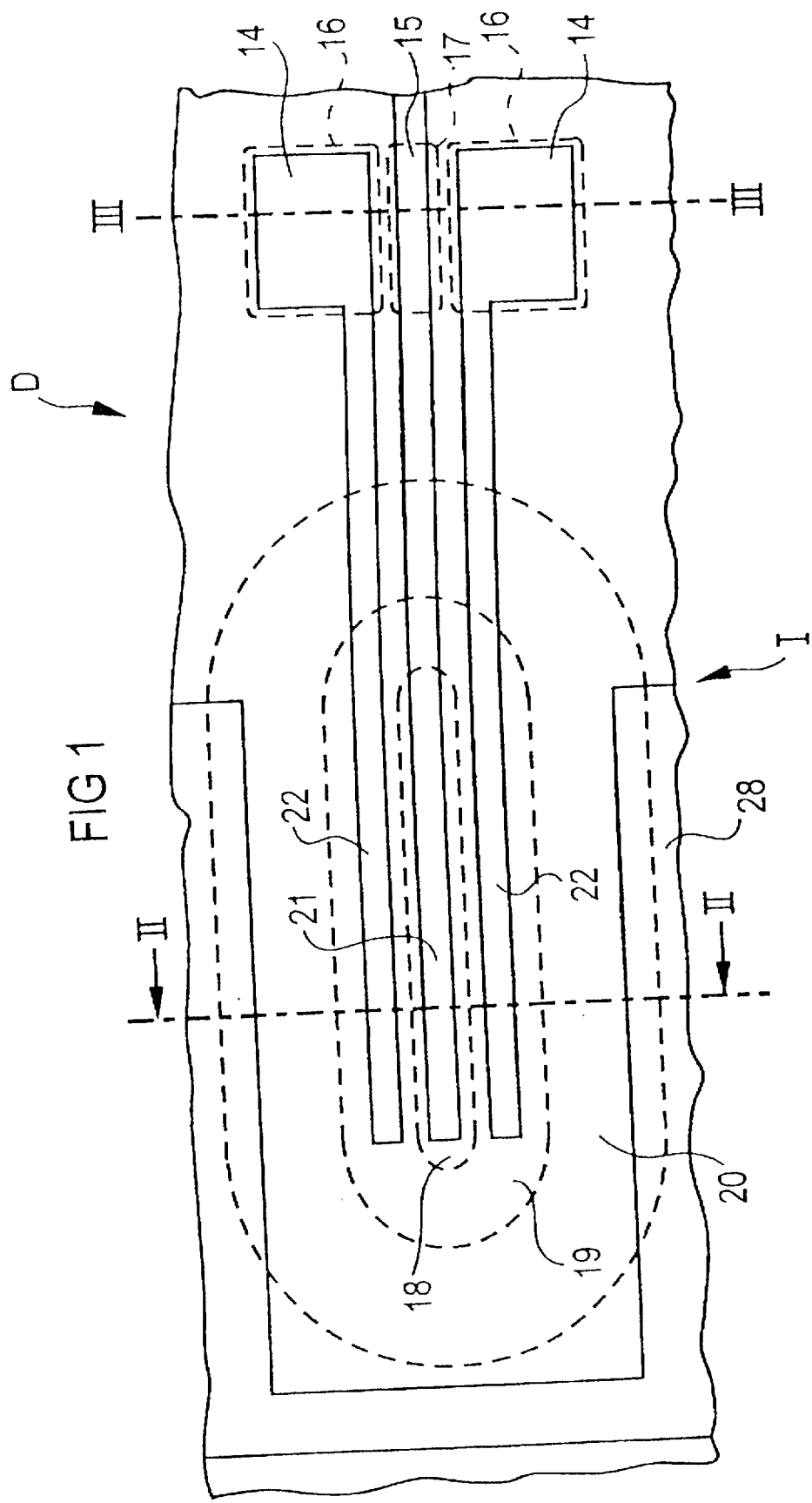
FIG. 1 is a plan view of an integrated circuit arrangement having an IGBT and a low-voltage diode constructed in accordance with the principles of the present invention.

FIG. 1 shows a plan view of an integrated circuit arrangement according to the invention, having an IGBT I and a diode D. Broken lines show the positions of a $p^+$-doped emitter structure 18, an $n^+$-doped connection zone 19 and a $n^-$-doped drift area 20. The emitter structure 18 has a doping concentration of, e.g., $10^{19}$ $cm^{-3}$, the connection zone 19 has a doping concentration of, e.g., $10^{19}$ $cm^{-3}$ and the drift area 20 has a doping concentration of, e.g., $6 \times 10^{14}$ $cm^{-3}$.

The emitter structure 18 is connected to an anode 21 running above the emitter structure 18. The $n^+$-doped connection zone 19, which annularly surrounds the emitter structure 18 on the surface, is provided with two secondary contacts 22. The secondary contacts 22 run parallel to the anode 21 above the $n^+$-doped connection zone 19.

Broken lines further indicate the position of two $p^+$-doped zones 16 as well as an $n^+$-doped zone 17 of the diode D. The $p^+$-doped zones 16 have a doping concentration of, e.g., $10^{19}$ $cm^3$ and the $n^+$-doped zone 17 has a doping concentration of $10^{19}$ $cm^{-3}$.

Each p$^+$-doped zone 16 has a first contact 14. Further, each of the first contacts 14 is electrically connected with one of the secondary contacts 22. A contact 15, connected with the n$^+$-doped zone 17 is arranged above the n$^+$-doped zone 17. The second contact 15 is also connected with the anode 21.

Figure 2:
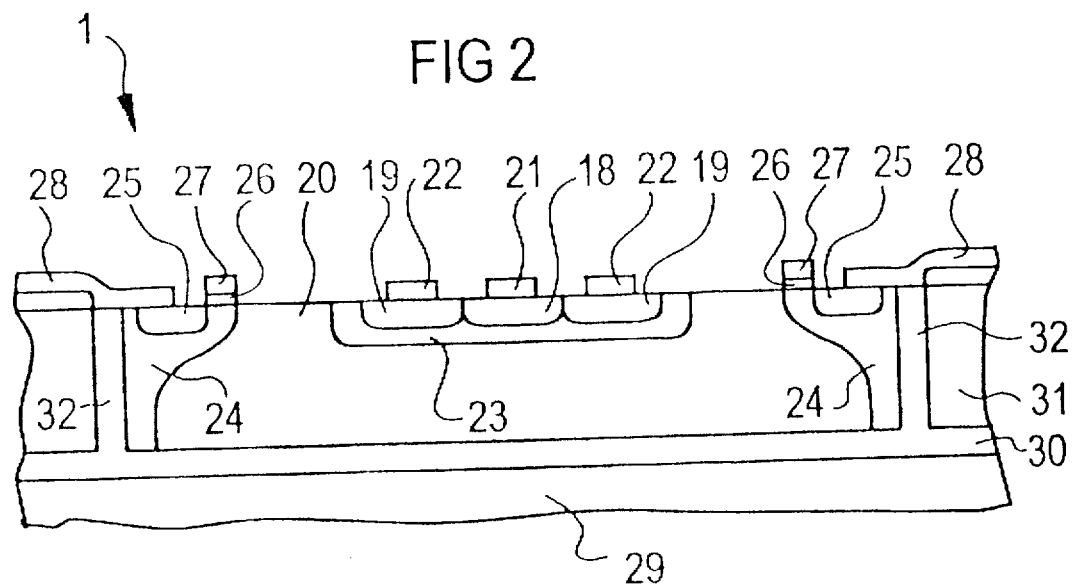
FIG. 2 is a section through the IGBT of FIG. 1 taken along line II—II.

FIG. 2 shows a section through the IGBT I of FIG. 1 along line II—II. The emitter structure 18 and the connection zone 19 are arranged in an n-doped island 23, which is arranged in the drift area 20. The drift area 20 borders a p-doped zone 24 comprising a channel area of the IGBT. The p-doped zone 24 has a doping concentration of, e.g., $2 \times 10^{17}$ cm$^{-3}$. An n$^+$-doped annular source zone 25 is arranged in the p-doped zone 24. A gate dielectric 26 is arranged on the surface of the channel area, and a gate electrode is arranged on the gate dielectric 26. (The gate electrode 27 is not shown in the view in FIG. 1 for clarity.) On the side of the source zone 25 facing away from the channel area, the source zone 25 and the p-doped zone 24 are connected with one another via a cathode 28 arranged on the surface.

The IGBT I is implemented in an SOI substrate formed by a stacked sequence of a monocrystalline silicon wafer 29, an insulating layer 30 and a monocrystalline silicon layer 31. The IGBT I is implemented in the silicon layer 31. It is completely surrounded by an insulating trench 32 that extends to the surface of the insulating layer 30 and is filled with insulating material.

Figure 3:
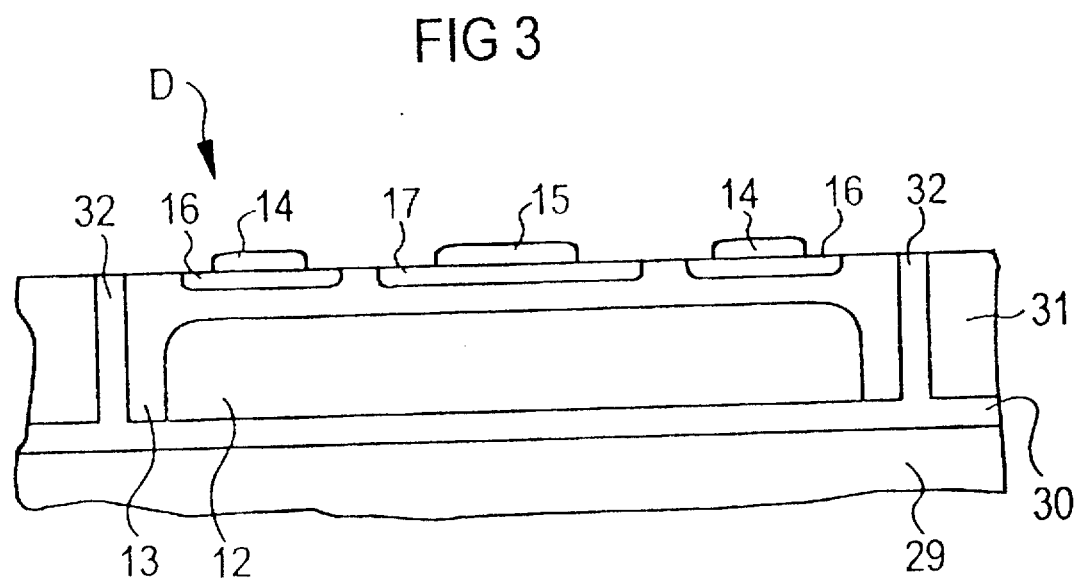
FIG. 3 is a section through the low-voltage diode of FIG. 1 taken along line III—III.

The diode D is implemented outside the insulating trench 32 in the silicon layer 31 (see FIG. 1 and the section designated III—III in FIG. 1, which is shown in FIG. 3). The diode D is also completely surrounded by an insulating trench 32, which is filled with insulating material and which extends to the surface of the insulating layer 30. The p$^+$-doped zones 16 as well as the n$^+$-doped zone 17 are arranged in a p-doped well 13. On the walls of the insulating trench 32, the p-doped well 13, which has a doping concentration of, e.g., $5 \times 10^{17}$ cm$^{-3}$, extends to the surface of the insulating layer 30. The p-doped well 13 has a depth of, e.g., 3 μm. An n-doped zone 12, having a doping concentration of, e.g., $6 \times 10^{14}$ cm$^{-3}$, is arranged underneath the p-doped well 13.

In the activated state of the IGBT I, the main current flows via the anode 21. The diode D is in this case polarized in the reverse direction. If during deactivation of the IGBT I a voltage reversal ensues, the diode D is then polarized in the forward direction. The main current then flows via the diode D, the secondary contact 22 and the pn-junction, which is formed from the drift area 20 and the p-doped zone 24 and is polarized in the forward direction, and which forms an internal free-running diode. In this way a breakdown of the pn-junction, which is polarized in this case in the reverse direction and which is formed from the emitter structure 18 and the n-doped island 23, is avoided.

Through duplication of the finger structure of the emitter structure 18 and corresponding duplication of the n$^+$-doped zones 17 and the p$^+$-doped zones 16 of the diode D, the inventive can be replicated for large-area integrated components.

Although modifications and changes may be suggested by those skilled in the art, it is the intention of the inventors to embody within the patent warranted hereon all changes and modifications as reasonably and properly come within the scope of their contribution to the art.

I claim as my invention:

1. An integrated circuit arrangement comprising:
    an insulated gate bipolar transistor having a drift area, a channel area, a gate dielectric, a gate electrode, a source zone, an emitter structure, a transistor cathode connected with said source zone and with said channel area, a transistor anode connected with said emitter structure, and a secondary contact connected with said drift area; and
    a diode having a diode anode and a diode cathode, said diode being laterally spaced from said insulated gate bipolar transistor and connected between said secondary contact and said transistor anode with said diode cathode connected with said transistor anode and with said diode anode connected with said secondary contact.

2. An integrated circuit arrangement as claimed in claim 1 further comprising:
    a silicon-on-insulator substrate having a silicon layer disposed on an insulating layer;
    said insulated gate bipolar transistor and said diode being integrated in said silicon layer with said insulated gate bipolar transistor integrated as a lateral insulated gate bipolar transistor;
    an insulating trench disposed in said silicon layer completely surrounding said insulated gate bipolar transistor and extending to a surface of said insulating layer; and
    said silicon layer consisting of doped material having a doping concentration causing an electrical field arising when said insulated gate bipolar transistor is in a blocking state to be directed into said insulating layer.

3. An integrated circuit arrangement as claimed in claim 1, wherein said drift area consists of doped material having a conductivity type and having a first doping concentration, said drift area containing a connection area therein consisting of said doped material of said conductivity type and having a second doping concentration, said second doping concentration being higher than said first doping concentration, and said secondary contact being disposed on said connection area.

4. An integrated circuit arrangement as claimed in claim 1 wherein said diode comprises a pn-diode.

5. An integrated circuit arrangement as claimed in claim 1 wherein said diode comprises a Schottky diode.

* * * * *